United States Patent
Lentine et al.

(10) Patent No.: US 9,831,369 B2
(45) Date of Patent: Nov. 28, 2017

(54) PHOTOVOLTAIC POWER GENERATION SYSTEM WITH PHOTOVOLTAIC CELLS AS BYPASS DIODES

(71) Applicant: National Technology & Engineering Solutions of Sandia, LLC, Albuquerque, NM (US)

(72) Inventors: Anthony L. Lentine, Albuquerque, NM (US); Gregory N. Nielson, Albuquerque, NM (US); Anna Tauke-Pedretti, Albuquerque, NM (US); Jose Luis Cruz-Campa, Albuquerque, NM (US); Murat Okandan, Edgewood, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 446 days.

(21) Appl. No.: 14/061,946

(22) Filed: Oct. 24, 2013

(65) Prior Publication Data

US 2015/0114444 A1 Apr. 30, 2015

(51) Int. Cl.
*H01L 31/00* (2006.01)
*H01L 31/05* (2014.01)
(Continued)

(52) U.S. Cl.
CPC ............ *H01L 31/05* (2013.01); *H01L 31/042* (2013.01); *H01L 31/044* (2014.12); *Y02E 10/50* (2013.01)

(58) Field of Classification Search
CPC ...... H01L 31/05; H01L 31/044; H01L 31/042
See application file for complete search history.

(56) References Cited

U.S. PATENT DOCUMENTS 4,353,161 A * 10/1982 Turner .................. H01L 31/042
136/244
5,248,346 A * 9/1993 Fraas .................. H01L 31/0693
136/244

(Continued)

OTHER PUBLICATIONS

Lentine, et al., "Optimal Cell Connections for Improved Shading, Reliability, and Spectral Performance of Microsystem Enabled Photovoltaic (MEPV) Modules," Photovoltaic Specialists Conference (PVSC), 2010 35th IEEE, Jun. 20-25, 2010, pp. 3048-3054.

(Continued)

*Primary Examiner* — Uyen Tran
(74) *Attorney, Agent, or Firm* — Martin I. Finston

(57) ABSTRACT

A photovoltaic power generation system that includes a solar panel is described herein. The solar panel includes a photovoltaic sub-module, which includes a group of microsystem enabled photovoltaic cells. The group includes a first string of photovoltaic cells, a second string of photovoltaic cells, and a differing photovoltaic cell. Photovoltaic cells in the first string are electrically connected in series, and photovoltaic cells in the second string are electrically connected in series. Further, the first string of photovoltaic cells, the second string of photovoltaic cells, and the differing photovoltaic cell are electrically connected in parallel. Moreover, the differing photovoltaic cell is used as a bypass diode for the first string of photovoltaic cells and the second string of photovoltaic cells.

7 Claims, 8 Drawing Sheets

(51) Int. Cl.
*H01L 31/042* (2014.01)
*H01L 31/044* (2014.01)

(56) References Cited

U.S. PATENT DOCUMENTS

| | | | |
|---|---|---|---|
| 5,593,901 | A | 1/1997 | Oswald et al. |
| 5,720,452 | A | 2/1998 | Mutschler, Jr. et al. |
| 6,225,793 | B1 | 5/2001 | Dickmann |
| 7,521,630 | B2 | 4/2009 | Ball |
| 7,709,727 | B2 | 5/2010 | Ruediger et al. |
| 7,932,462 | B2 | 4/2011 | Van Riesen et al. |
| 8,067,295 | B2 | 11/2011 | Yagiura et al. |
| 8,093,492 | B2 | 1/2012 | Hering et al. |
| 8,329,503 | B1 | 12/2012 | Nielson et al. |
| 2004/0261837 | A1* | 12/2004 | Friedman .......... H01L 31/03046 136/249 |
| 2007/0137698 | A1* | 6/2007 | Wanlass ................ H01L 31/042 136/261 |
| 2008/0136367 | A1* | 6/2008 | Adest .................... H02J 7/0063 320/103 |
| 2009/0114262 | A1* | 5/2009 | Adriani ................ B23K 1/0008 136/244 |
| 2009/0217965 | A1* | 9/2009 | Dougal .................... G05F 1/67 136/244 |
| 2011/0005569 | A1 | 1/2011 | Sauar et al. |
| 2011/0308565 | A1 | 12/2011 | Takayama et al. |
| 2012/0006483 | A1 | 1/2012 | Hanoka et al. |
| 2012/0031468 | A1 | 2/2012 | Boise et al. |
| 2012/0060890 | A1 | 3/2012 | Park et al. |
| 2012/0103388 | A1 | 5/2012 | Meakin et al. |
| 2012/0118358 | A1 | 5/2012 | Hong |
| 2012/0122262 | A1 | 5/2012 | Kang et al. |
| 2012/0298166 | A1* | 11/2012 | Chen .................... H01L 31/044 136/244 |

OTHER PUBLICATIONS

Lentine, et al., "Enhanced Efficiency for Voltage Matched Stacked Multi-Junction Cells: Optimization with Yearly Temperature and Spectra Variations," Photovoltaic Specialists Conference (PVSC-39), Jun. 16-21, 2013, pp. 1-3.

Nielson, et al., "Leveraging Scale Effects to Create Next-Generation Photovoltaic Systems Through Micro- and Nanotechnologies," Proc. of SPIE, vol. 8373, May 1, 2012, pp. 1-10.

Sweatt, et al., "Micro-Optics for High-Efficiency Optical Performance and Simplified Tracking for Concentrated Photovoltaics (CPV)", International Optical Design Conference (IODC), Jul. 13, 2010. pp. 1-8.

Johnson, et al., "Photovoltaic AC Module Composed of a Very Large Number of Interleaved Inverters", Applied Power Electronics Conference and Exposition (APEC), 2011 Twenty-Sixth Annual IEEE, Mar. 2011. pp. 976-981.

Gee, et al., "The Potential Performance of GaAs-based Mechanically Multijunction Solar Concentrator Cells", Photovoltaic Specialists Conference, 1990., Conference Record of the Twenty First IEEE, 1990. pp. 41-46.

* cited by examiner

PHOTOVOLTAIC POWER GENERATION SYSTEM WITH PHOTOVOLTAIC CELLS AS BYPASS DIODES

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

Environmental concerns pertaining to utilization of fossil fuels to generate electric power together with the non-renewable nature of such fossil fuels have increased demand for alternative energy sources. Exemplary electric power systems that utilize renewable energy resources include solar power systems, wind power systems, hydroelectric power systems, geothermal power systems, amongst others.

Conventional solar power systems, particularly those utilized to provide electric power to a residence, include solar panels that comprise a plurality of relatively large silicon photovoltaic cells (e.g., approximately six inches by six inches). For instance, a single solar panel can include approximately seventy two cells. The solar cells are manufactured to output a certain voltage (e.g., 0.6 volts for silicon cells) that is approximately constant regardless of an amount of solar radiation of particular wavelengths received at the solar cells, and are electrically connected in series within a solar panel, such that the solar panel produces approximately 40 volts. A typical residential solar system includes several solar panels (e.g., 5-10), and the panels are electrically connected in series, thereby resulting in several hundred cells being electrically connected in series that, collectively, output a voltage that is approximately equal to the sum of the voltages of the individual cells. It is to be noted, however, that when solar cells and panels are arranged electrically in series, the current must be equal across each of the cells in each of the solar panels.

Since the current of a photovoltaic cell is proportional to the light that is incident on the cell, if one cell of series connection receives a low light level, the entire series connection has a low current. Thus, a typical solar power system configuration that includes several solar panels can have a severe current reduction (and power output reduction) when one cell or a portion of a cell has a low light level (e.g., due to shading). Oftentimes, when solar power systems are installed on residences or other buildings, trees or other obstructions may be nearby, and accordingly, shading of at least a portion of a module can occur frequently.

When shading occurs across a solar power system in a certain pattern, unless protective electric devices are in place, solar cells can be severely damaged. For instance, if a single solar cell is shaded by an obstruction, and all other cells in the solar power system are illuminated, then the single cell can be driven into reverse breakdown to support the current flow generated by the other cells. In current solar power installations, cell current is approximately five amperes, and silicon cells can have a breakdown voltage from as low as approximately 12 volts to as high as 60 volts or more, depending on the cell design and manufacture techniques used to produce the cell. As breakdown is not a uniform process across a large cell, the relatively large current (live amperes) and the relatively large power (upwards of one hundred watts) can cause the device to malfunction in either a shorted or open state, causing improper operation and permanent damage to the cell, panel, and/or installation.

Conventionally, to prevent photovoltaic cells in solar power installations from being driven into reverse breakdown, bypass diodes are selectively positioned across the cells, thereby diverting current from cells with no photocurrent and preventing such cells from entering the breakdown region. Each bypass diode can normally protect one third of the cells in a panel (e.g., there are oftentimes three bypass diodes in a panel). However, if one cell is shaded, power production from all of the cells covered by a bypass diode (e.g., one third of the cells in the panel) will be lost, which can result in excessive power production loss. Moreover, utilization of traditional bypass diodes commonly increases assembly time of solar panels due to the additional assembly step of adding the bypass diodes. For space applications of photovoltaic systems where it is common to have one bypass diode for each cell, the costs associated with the bypass diodes can become quite high.

SUMMARY

The following is a brief summary of subject matter that is described in greater detail herein. This summary is not intended to be limiting as to the scope of the claims.

Described herein are various technologies pertaining to photovoltaic power generation systems. More particularly, photovoltaic power generation systems that include a plurality of microsystem enabled photovoltaic cells, where a subset of the microsystem enabled photovoltaic cells are used as bypass diodes, are described herein. In an exemplary embodiment, a photovoltaic power generation system can include at least one solar panel (also referred to as a module) that is composed of a plurality of photovoltaic sub-modules. Each photovoltaic sub-module can have an operating voltage of between 12 volts and 2000 volts, and multiple panels, therefore, can be arranged electrically in parallel. A nominal operating voltage of the solar panel is generally in a range between 200 volts and 500 volts, which is substantially optimal for conventional commercial inverters, because of the present-day regulatory limit of 600 volts in the United States, although the appended claims are not to be so limited by such regulatory limit. Further, in an exemplary embodiment, a photovoltaic sub-module can be less than 30 cm in width and less than 30 cm in length, although sub-modules of other sizes are contemplated.

In various exemplary embodiments, each photovoltaic sub-module can comprise a plurality of groups of connected microsystem enabled photovoltaic cells. Each group can include a plurality of strings of photovoltaic cells, wherein photovoltaic cells in a string are electrically connected in series. Each group can also include a differing photovoltaic cell. The strings of photovoltaic cells and the differing photovoltaic cell of a group are electrically connected in parallel. Moreover, the differing photovoltaic cell is used as a bypass diode for the strings of photovoltaic cells in the group. Thus, the differing photovoltaic cell can provide a current path in the event that one or more of the other photovoltaic cells in the group are shaded, which protects the photovoltaic cells in the group against large reverse bias voltages.

According to various examples, a polarity of the differing photovoltaic cell can be inverted in comparison to polarities of the photovoltaic cells in the strings of photovoltaic cells in the group. Further, the differing photovoltaic cell can be substantially similar to at least a subset of the remaining photovoltaic cells in the group. Also, the differing photovoltaic cell and at least the subset of the remaining photovoltaic cells in the group can be mounted on a common surface (e.g., same surface of as substrate). Pursuant to various embodiments, the differing photovoltaic cell can be an additional photovoltaic cell added to the group. In accordance with other exemplary embodiments, the differing photovoltaic cell can be a photovoltaic cell used as the bypass diode rather than being included in one of the strings in the group (e.g., one of the strings in the group can include one less photovoltaic cell which can cause voltage mismatch between that string and the remaining strings in the group).

Other aspects will be appreciated upon reading and understanding the attached figures and description.

DETAILED DESCRIPTION

Figure 1:
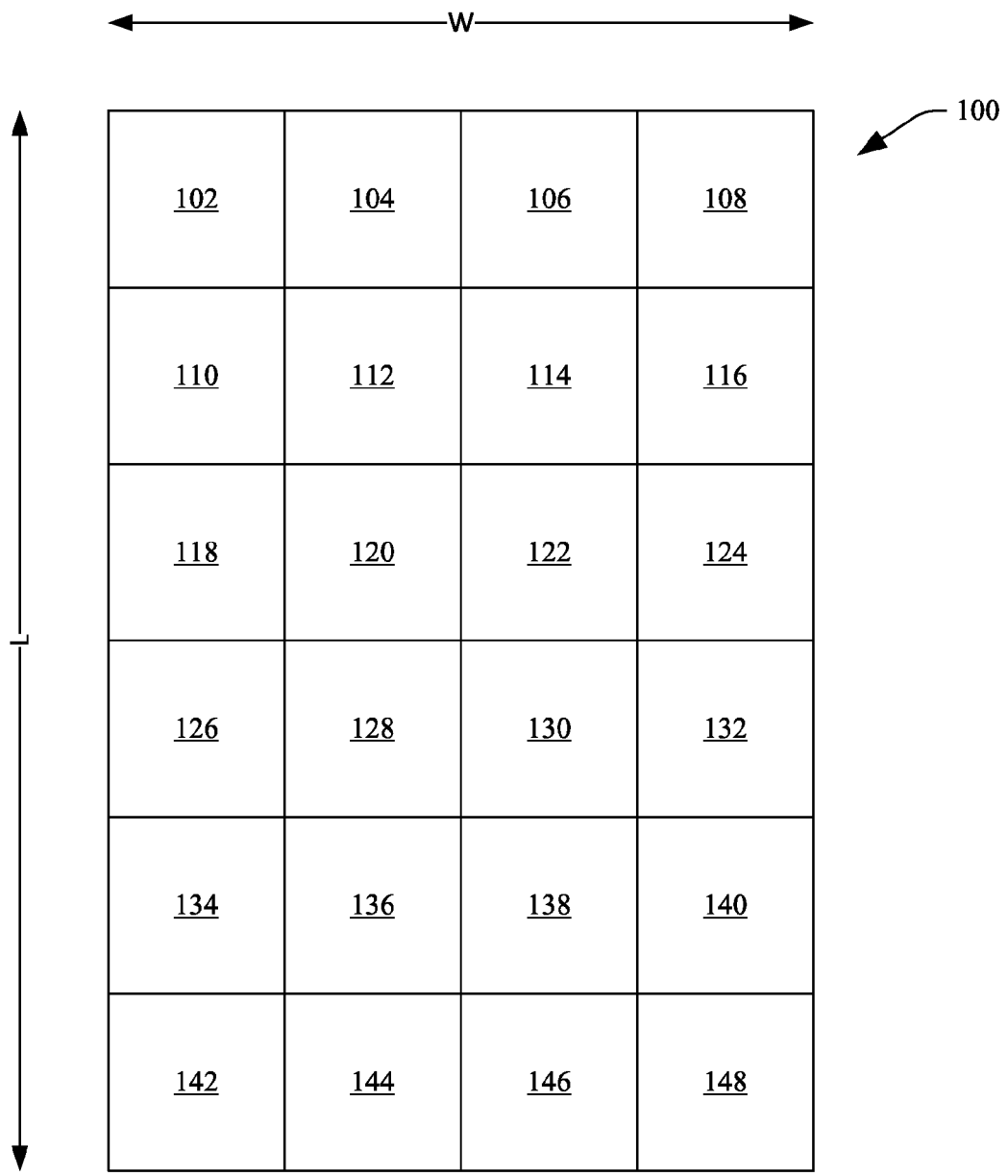
FIG. 1 illustrates an exemplary solar panel that includes a plurality of photovoltaic sub-modules.

Various technologies pertaining to photovoltaic power generation systems are now described with reference to the drawings, wherein like reference numerals are used to refer to like elements throughout. In the following description, for purposes of explanation, numerous specific details are set firth in order to provide a thorough understanding of one or more aspects. It may be evident, however, that such aspect(s) may be practiced without these specific details. In other instances, well-known structures and devices are shown in block diagram form in order to facilitate describing one or more aspects.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Referring now to the drawings, FIG. 1 illustrates an exemplary solar panel 100 that includes photovoltaic cells, where a subset of the photovoltaic cells are used as bypass diodes. In an exemplary embodiment, the solar panel 100 can be between one meter and two meters in length, and between one half meter and 1½ meters in width. Furthermore, the solar panel 100 can be configured to output between 200 volts and 300 volts, although in other embodiments the solar panel 100 can be configured to output up to 2000 volts. Pursuant to a particular example, the solar panel 100 can be configured to output 240 volts. As will be understood by one skilled in the art, however, an amount of voltage that can be output by the solar panel 100 can depend upon an application in which the solar panel 100 is employed and may be higher or lower than the 200-300 volt range.

The solar panel 100 comprises a plurality of photovoltaic sub-modules 102-148. While the solar panel 100 is shown as including 24 photovoltaic sub-modules, it is to be understood that the solar panel 100 may include more or fewer photovoltaic sub-modules, depending upon the application in which the solar panel 100 is employed, amount of space available upon which to install the solar panel 100, as well as the arrangement of the photovoltaic sub-modules 102-148 in the solar panel 100.

In an exemplary embodiment, the photovoltaic sub-modules 102-148 can be electrically connected in parallel With one another. Therefore, each of the photovoltaic sub-modules can output approximately the same voltage (e.g., between 200 and 300 volts). In another exemplary embodiment, rather than each of the photovoltaic sub-modules 102-148 being electrically connected in parallel, at least a subset of the photovoltaic sub-modules 102-148 can be connected to a power management integrated circuit, wherein such integrated circuit can be configured to output desired voltage and/or current levels resulting from the power that is produced from the subset of the photovoltaic sub-modules 102-148 electrically connected thereto. For instance, the solar panel 100 can include a single integrated circuit that is connected to each of the photovoltaic sub-modules 102-148 directly. The power management integrated circuit can then cause a final amount of power to be output by the solar panel 100 to be at a predefined, desired level (voltage and current). Further, the amount of power to be output by the solar panel 100 can be dynamically adjustable by the power management integrated circuit based on external operating conditions and/or system operation commands. In another exemplary arrangement, subsets of photovoltaic sub-modules can be coupled in parallel, and such subsets can be connected to the power management integrated circuit. For instance, a first subset of photovoltaic sub-modules can include the photovoltaic sub-modules 102, 104, 106 and 108, which can be electrically connected in parallel. Similarly, a second subset of photovoltaic sub-modules can include the photovoltaic sub-modules 110, 112, 114 and 116, which can be electrically connected in parallel. The first subset of photovoltaic sub-modules and second subset of photovoltaic sub-modules may then be connected to the integrated circuit, which performs power management to cause a desired amount of power to be output by the solar panel 100. Other arrangements are also contemplated and are intended to fall under the scope of the hereto-appended claims.

Figure 2:
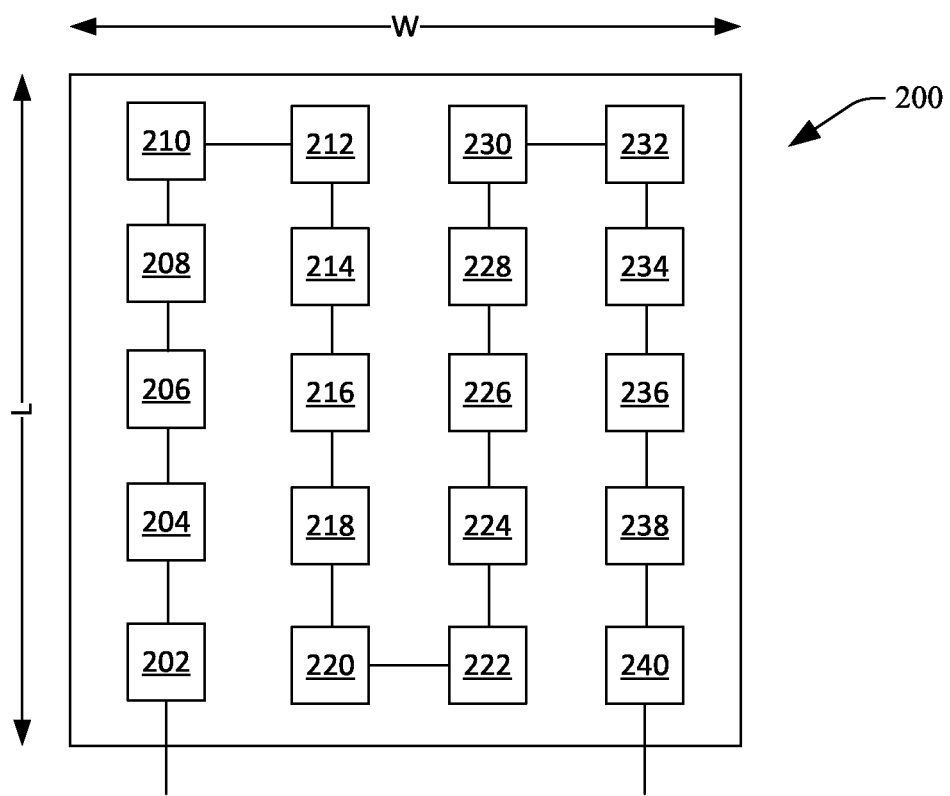
FIG. 2 illustrates an exemplary photovoltaic sub-module that includes a plurality of photovoltaic groups of electrically connected photovoltaic cells.

Now referring to FIG. 2, an exemplary photovoltaic sub-module 200 that can be included in the solar panel 100 is illustrated. Pursuant to an example, size of the photovoltaic sub-module 200 can be between 10 centimeters and 30 centimeters in length, and between 10 centimeters and 30 centimeters in width. The photovoltaic sub-module 200 comprises a plurality of groups 202-240 of electrically connected photovoltaic cells, wherein the groups 202-240 are electrically connected in series. While the photovoltaic sub-module 200 is shown as including 20 groups, it is to be understood that a number and arrangement of groups in the photovoltaic sub-module 200 can depend upon a desired voltage output by the photovoltaic sub-module 200. Furthermore, while the photovoltaic sub-module 200 is shown as being a definable, physical sub-element of a solar panel, it is to be understood that a photovoltaic sub-module can be defined by a circuit that is employed to connect cells in a solar panel; both arrangements are intended to fall under the scope of the hereto-appended claims.

Pursuant to an example, the photovoltaic sub-module 200 can comprise 20 groups (e.g., the groups 202-240), wherein each of the groups is configured to output a consistent voltage; for example, approximately 2.4 volts. In such example, the desired output of the photovoltaic sub-module 200 is approximately 48 volts. Further following this example, the current passing through the groups 202-240 can be relatively low (on the order of milliamps).

According to another example (not shown), a photovoltaic sub-module (substantially similar to the photovoltaic sub-module 200) can comprise approximately 100 groups (substantially similar to the groups 202-240) electrically connected in series. Each of the 100 groups can be configured to output a consistent voltage (e.g., approximately 2.4 volts). Thus, the desired output of such photovoltaic sub-module is approximately 240 volts.

Moreover, it is contemplated that some of the groups may be connected in parallel. For instance, the photovoltaic sub-module 200 can comprise a first plurality of groups that are connected in series and a second plurality of groups that are connected in series, wherein the first plurality of groups and the second plurality of groups are connected in parallel.

Figure 3:
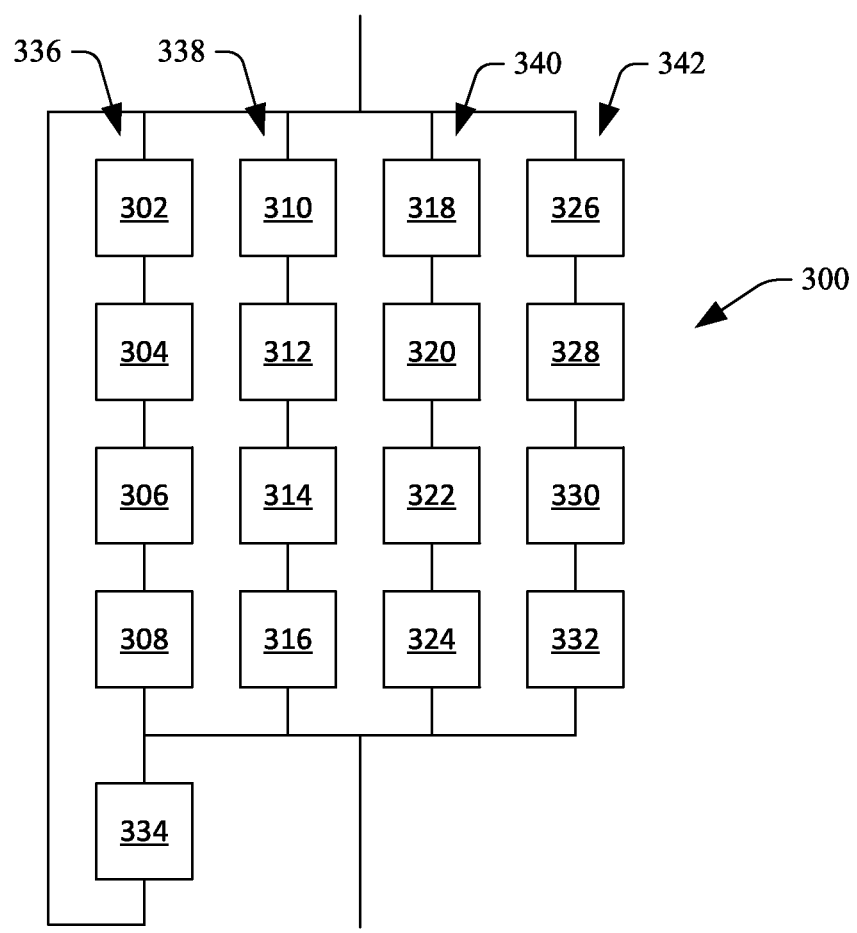
FIG. 3 illustrates an exemplary group of photovoltaic cells that includes a plurality of strings of photovoltaic cells and a photovoltaic cell configured as a bypass diode.

Now referring to FIG. 3, an exemplary group 300 that can be included as one of the groups 202-240 in the photovoltaic sub-module 200 is illustrated. The group 300 comprises a plurality of photovoltaic cells 302-334. Pursuant to an example, the photovoltaic cells 302-334 can be microsystem enable photovoltaic cells that are relatively thin (1.0-50 micrometers thick), small (50 micrometers-10 millimeters laterally) photovoltaic cells that are built using microfabrication concepts. In another example, a photovoltaic cell can be no larger than two centimeters in length by two centimeters in width. For instance, the following references, which are incorporated herein by reference, describe the building of photovoltaic modules that comprise numerous photovoltaic cells using microfabrication techniques: Nielson, et al., "Microscale C-SI (C) PV Cells for Low-Cost Power", 34th IEEE Photovoltaic Specialist Conference, Jun. 7-10, 2009, Philadelphia, Pa., 978-1-4244-2950/90, and Nielson, et al., "Microscale PV Cells for Concentrated PV Applications," 24th European Photovoltaic Solar Energy Conference, Sep. 21-25, 2009, Hamburg, Germany 3-936338-25-6. In summary, such references describe one sun and concentrating systems with integrated micro-optical lenses, and further describe relatively thin cells that have been fabricated using epitaxial lift-off in Silicon (Si) and Gallium Arsenide (GaAs) with efficiencies exceeding 10%.

Accordingly, the photovoltaic cells 302-334 can be or include Si cells. Additionally or alternatively, the photovoltaic cells 302-334 can be or include III-V photovoltaic cells (e.g., GaAs cells, Indium Gallium Phosphorous (Phosphide) (InGaP) cells. Indium Gallium Arsenide (InGaAs) cells, Indium Gallium Nitride (InGaN) cells, etc.). Additionally or alternatively, the photovoltaic cells 302-334 can include at least one Germanium (Ge) photovoltaic cell. Still further, the photovoltaic cells 302-334 can be, or may be included in, multi-junction series connected monolithic cells or multi-junction optimally connected heterogeneous cells. For instance, multi-junction optimally connected heterogeneous cells include layers of differing types of photovoltaic cells with differing hand gaps. Heterogeneously integrating (e.g., vertically stacking) different cell types with dielectric layers therebetween can yield high performance multi-junction cells, where a designer of a photovoltaic panel is free from lattice matching and series connected constraints of monolithic cells.

In an exemplary embodiment, each of the photovoltaic cells 302-334 can be a multi-junction cell wherein, for each multi-junction cell, layers are integrally connected. This effectively creates a string of photovoltaic cells electrically connected in series in a relatively small amount of space. In another exemplary embodiment, cells in a multi-junction cell may not be integrally connected. In yet another exemplary embodiment, the photovoltaic cells 302-334 can be of the same type (e.g., silicon). Other arrangements of photovoltaic cells are also contemplated.

In an exemplary embodiment, the group 300 can comprise a first string of photovoltaic cells 336 a second string of photovoltaic cells 338, a third string of photovoltaic cells 340, and a fourth string of photovoltaic cells 342. The first string of photovoltaic cells 336 comprises the photovoltaic cells 302-308 electrically connected in series. Similarly, the second string of photovoltaic cells 338 comprises photovoltaic cells 310-316 electrically connected in series. The third string of photovoltaic cells 340 comprises the photovoltaic cells 318-324 electrically connected in series, and the fourth string of photovoltaic cells 342 comprises the photovoltaic cells 326-332 electrically connected in series. The first string of photovoltaic cells 336, the second string of photovoltaic cells 338, the third string of photovoltaic cells 340, and the fourth string of photovoltaic cells 342 are electrically connected in parallel.

Moreover, they group 300 comprises the photovoltaic cell 334, which can be substantially similar to the photovoltaic cells 302-308 in the first string of photovoltaic cells 336. The photovoltaic cell 334 can also be substantially similar to the photovoltaic cells 310-316 in the second string of photovoltaic cells 338, substantially similar to the photovoltaic cells 318-324 in the third stringy of photovoltaic cells 340, and/or substantially similar to the photovoltaic cells 326-332 in the fourth string of photovoltaic cells 342. As used herein, a photovoltaic cell can be "substantial similar" to a disparate photovoltaic cell by having a substantially similar size (e.g., less than a ten percent difference in length, width, or height between the photovoltaic cell and the disparate photovoltaic cell), and both the photovoltaic cell and the disparate photovoltaic cell being a common cell type.

The photovoltaic cell 334 is electrically connected in parallel with the first string of photovoltaic cells 336, the second string of photovoltaic cells 338, the third string of photovoltaic cells 340, and the fourth string of photovoltaic cells 342. Further, the photovoltaic cell 334 and at least the photovoltaic cells 302-308 of the first string of photovoltaic cells 336 can be mounted on a common surface (e.g., same surface of a substrate, etc.).

The photovoltaic cell 334 can be used as a bypass diode that protects the photovoltaic cells 302-332 in the strings of photovoltaic cells 336-342. By using, the photovoltaic cell 334 as a bypass diode, rather than a traditional bypass diode, assembly of a solar panel can be simplified (e.g., by removing a process step for incorporation of the traditional bypass diode) and cost of manufacturing the solar panel can be reduced (e.g., by not using the extra type of diode for the traditional bypass diode). Polarity of the photovoltaic cell 334 can be inverted in comparison to polarities of the photovoltaic cells 302-332 in the strings of photovoltaic cells 336-342. Thus, the photovoltaic cell 334 provides a current path in the event that one or more of the photovoltaic cells 302-332 are shaded, which protects the photovoltaic cells 302-332 against large reverse bias voltages.

According to various embodiments, an optical input of the photovoltaic cell 334 can be blocked to enhance efficiency of the photovoltaic cell 334 as a bypass diode (e.g., photocurrent can cause decreased efficiency if the optical input is not blocked). The optical input can be blocked, for example, by covering an optical window with additional metallization to block light for the photovoltaic cell 334. However, it is also contemplated that in other embodiments the optical input of the photovoltaic cell 334 need not be blocked.

As will be understood by one skilled in the art, different types of photovoltaic cells have different operating voltages. For instance, if the photovoltaic cells 302-334 are Ge cells, the operating voltage may be approximately 0.3 volts. If the photovoltaic cells 302-334 are Si cells, then the operating voltage can be approximately 0.6 volts. If the photovoltaic cells 302-334 are GaAs cells, then the operating voltage may be approximately 0.9 volts, and if the photovoltaic cells 302-334 are InGaP cells, then the operating voltage may be approximately 1.3 volts. Pursuant to an example, the photovoltaic cells 302-334 can be Si cells. In such an example, each of the strings of photovoltaic cells 336-342 outputs approximately 2.4 volts (a common voltage), and therefore the output of the group 300 is approximately 2.4 volts. Following this example, the photovoltaic cell 334 can be an additional Si cell, which is substantially similar to the photovoltaic cells 302-308 in the first string of photovoltaic cells 336.

According to an example, each of the strings of photovoltaic cells 336-342 can be a different cell type, and each of the strings of photovoltaic cells 336-342 can have different numbers of cells for the different cell types, approximating the common voltage (e.g., the group 300 can include multi-junction optimally connected heterogeneous cells). For example, in an exemplary embodiment, the first string of photovoltaic cells 336 can include eight Germanium cells (8×0.3=2.4), the second string of photovoltaic cells 338 can include four Silicon cells (4×0.6=2.4), the third string of photovoltaic cells 340 can include three GaAs cells (3×0.9=2.7), and the fourth string of photovoltaic cells 342 can include two InGaP cells (2×1.3=2.6). The slight voltage mismatch is tolerable, and if desired, a larger number of cells and a higher voltage can be used to provide more precise voltage matching. In another embodiment described earlier, power management circuitry can be used to independently boost the voltages generated by the series connections of different cell types to a common voltage. If the desired output of the solar panel 100 is approximately 240 volts, then the photovoltaic sub-module 200 can include one hundred of the groups 300 electrically connected in series. Therefore, each sub-module 102-148 in the solar panel 100 outputs approximately 2.4 volts, and the output of the solar panel 100 is thus approximately 240 volts.

As noted above, the strings of photovoltaic cells 336-342 are often configured to output approximately the common voltage. Thus, in accordance with the exemplary embodiment set forth above, the group 300 can include strings of photovoltaic cells 336-342 configured to each output approximately the common voltage, with an additional photovoltaic cell (e.g., the photovoltaic cell 334) included in the group 300 that is utilized as a bypass diode. Accordingly, a first sum of operating voltages of the photovoltaic cells 302-308 in the first string of photovoltaic cells 336 can be approximately equal to a second sum of operating voltages of the photovoltaic cells 310-316 in the second string of photovoltaic cells 338. Likewise, the first sum of operating voltages can be approximately equal to a third sum of operating voltages of the photovoltaic cells 318-324 in the third string of photovoltaic cells 340. The first sum of operating voltages can also be approximately equal to a fourth sum of operating voltages of the photovoltaic cells 326-332 in the fourth string of photovoltaic cells 342. As used herein, the term "approximately equal" can refer to a difference in value of less than 10%.

Moreover, pursuant to this exemplary embodiment, when the photovoltaic cells 302-334 are a common cell type, a number of the photovoltaic cells 302-308 in the first string of photovoltaic cells 336 (e.g. 4 in the depicted example of FIG. 3) equals a number of photovoltaic cells 310-316 in the second string of photovoltaic cells 338. In accordance with the foregoing exemplary embodiment, the number of photovoltaic cells 302-308 in the first string of photovoltaic cells 336 also equals a number of photovoltaic cells 318-324 in the third string of photovoltaic cells 340 as well as a number of photovoltaic cells 326-332 in the fourth string of photovoltaic cells 342.

While FIG. 3 describes the photovoltaic cell 334 being substantially similar to the photovoltaic cells 302-308 in the first string of photovoltaic cells 336, other groups in the photovoltaic sub-module 200 can include photovoltaic cells used as bypass diodes that are substantially similar to the photovoltaic cells 310-316 in the second string of photovoltaic cells 338, substantially similar to the photovoltaic cells 318-324 in the third string of photovoltaic cells 340, and/or substantially similar to the photovoltaic cells 326-332 in the fourth string of photovoltaic cells 342.

Pursuant to another exemplary embodiment (not shown), rather than adding the additional photovoltaic cell 334 to the group 300, the photovoltaic cells 302-308 can be wired such that the photovoltaic cells 302-306 are electrically connected in series to form the first string of photovoltaic cells 336; further, the photovoltaic cell 308 and the first string a photovoltaic cells 336 (e.g., the series connected photovoltaic cells 302-306) are electrically connected in parallel. Thus, the photovoltaic cell 308 can be electrically connected in parallel with the first string of photovoltaic cells 336, the second string of photovoltaic ells 338 the third string of photovoltaic cells 340, and the fourth string of photovoltaic cells 342. Further, the polarity of the photovoltaic cell 308 can be inverted in comparison to the remaining photovoltaic cells 302-306 and 310-332. In accordance with this embodiment the photovoltaic cell 308 can be used as a bypass diode that protects the photovoltaic cells 302-306 and 310-332 in the strings of photovoltaic cells 336-342 (e.g., the photovoltaic cell 308 in this embodiment can be substantially similar to the additional photovoltaic cell 334 described above). Again reference is made to the example where the photovoltaic cells 302-332 are Si cells, each with an operating voltage of approximately 0.6 volts. Thus, the first string of photovoltaic cells 336 outputs approximately 1.8 volts, while each of the strings of photovoltaic cells 338-342 outputs approximately 2.4 volts. While such embodiment can lead to a voltage mismatch between the strings of photovoltaic cells 336-342, the photovoltaic cell 308 can be used as a bypass diode to protect the photovoltaic cells 302-306 and 310-332 against large reverse bias voltages.

Reference is continued to the exemplary embodiment where the photovoltaic cells 302-306 are electrically connected in series to form the first string of photovoltaic cells 336, and the photovoltaic cell 308 is electrically connected in parallel to the first string 336. Pursuant to this exemplary embodiment, a first sum of operating voltages of the photovoltaic cells 302-306 in the first string of photovoltaic cells 336 and the photovoltaic cell 308 used as a bypass diode can be approximately equal to a second sum of operating voltages of the photovoltaic cells 310-316 in the second string of photovoltaic cells 338. Likewise, the first sum of operating voltages can be approximately equal to a third sum of operating voltages of the photovoltaic cells 318-324 in the third string of photovoltaic cells 340. The first sum of operating voltages can also be approximately equal to a fourth sum of operating voltages of the photovoltaic cells 326-332 in the fourth string of photovoltaic cells 342. Moreover, according to this exemplary embodiment, when the photovoltaic cells 302-334 are a common cell type, a number of the photovoltaic cells 302-306 in the first string of photovoltaic cells 336 (e.g., 3 in the described example) differs from a number of photovoltaic cells 310-316 in the second string of photovoltaic cells 338 (e.g., 4 in the described example). The number of photovoltaic cells 302-306 in the first string of photovoltaic cells 336 also differs from a number of photovoltaic cells 318-324 in the third string of photovoltaic cells 340 (e.g., 4 in the described example) as well as a number of photovoltaic cells 326-332 in the fourth string of photovoltaic cells 342 (e.g., 4 in the described example).

Figure 6:
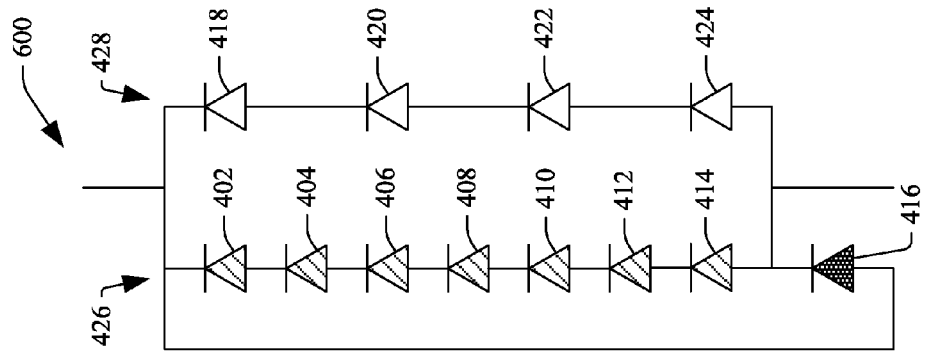
FIGS. 4-6 illustrate various topologies of exemplary groups (or portions thereof) that can be included in a photovoltaic sub-module.
Figure 5:
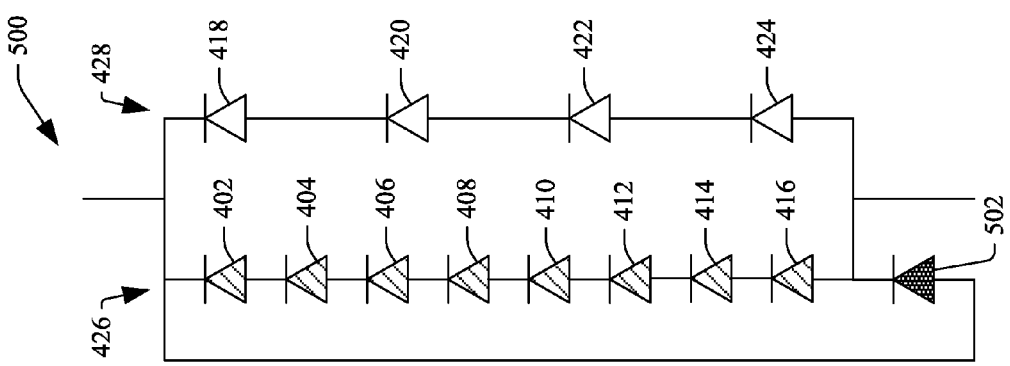
Figure 4:
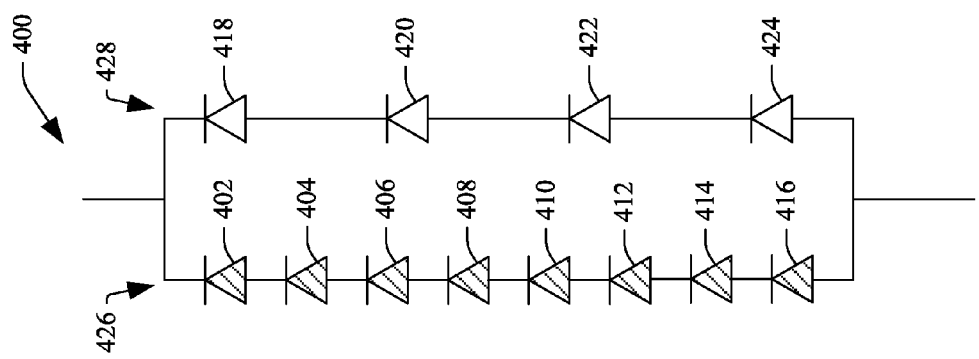

FIGS. 4-6 illustrate various topologies of exemplary groups (or portions thereof) that can be included in the photovoltaic sub-module 200. A group 400 of FIG. 4 illustrates a configuration of photovoltaic cells 402-424. The group 400 lacks a photovoltaic cell used as a bypass diode. Moreover, in a group 500 of FIG. 5, the configuration of the photovoltaic cells 402-424 is modified (relative to the group 400 of FIG. 4) to include an additional photovoltaic cell 502; the additional photovoltaic cell 502 is used as a bypass diode in the group 500. Further, in a group 600 of FIG. 6, the configuration of the photovoltaic cells 402-424 is modified (relative to the group 400 of FIG. 4) to use one of the photovoltaic cells 402-424 (e.g., the photovoltaic cell 416) as a bypass diode in the group 600.

While FIGS. 4-6 depict groups that include two strings of photovoltaic cells, it is contemplated that the groups can each include more than two strings of photovoltaic cells. Further, it is contemplated that other numbers of photovoltaic cells can be included in each of the stings, differing types of photovoltaic cells can be included in each of the strings, instead of being heterogeneous the groups need not mix differing types of photovoltaic cells, and so forth.

With reference to FIG. 4, illustrated is the group 400, which includes the photovoltaic cells 402-424. The group 400 includes a first string of photovoltaic cells 426 and a second string of photovoltaic cells 428. The first string of photovoltaic cells 426 includes the photovoltaic cells 402-416 electrically connected in series. The second string of photovoltaic cells 428 includes the photovoltaic cells 418-424 electrically connected in series. Further, the first string of photovoltaic cells 426 and the second string of photovoltaic cells 428 are electrically connected in parallel.

The photovoltaic cells 402-416 in the first string of photovoltaic cells 426 can be a first cell type and the photovoltaic cells 418-424 in the second string of photovoltaic cells 428 can be a second cell type. Pursuant to an example, the first string of photovoltaic cells 426 can include eight Germanium cells, and thus, can output approximately 2.4 volts (8×0.3=2.4). Further following this example, the second string of photovoltaic cells 428 can include four Silicon cells, and accordingly, can output approximately 2.4 volts (4×0.6=2.4). This example is continued below in connection with FIGS. 5-6; yet, it is to be appreciated that the example is provided for illustration purposes, and the claimed subject matter is not limited to such example (e.g., the strings of photovoltaic cells 426-428 can include different types and/or numbers of photovoltaic cells, the strings of photovoltaic cells 426-428 include a monolithic type of photovoltaic cell, the group 400 can include more than two strings of photovoltaic cells, etc.).

Turning to FIG. 5, illustrated is the group 500. The group 500 includes the first string of photovoltaic cells 426 (the photovoltaic cells 402-416 electrically connected in series) and the second string of photovoltaic cells (the photovoltaic cells 418-424 electrically connected in series). In comparison to the group 400 of FIG. 4, the group 500 includes the additional photovoltaic cell 502. The photovoltaic cell 502 and at least the photovoltaic cells 402-416 can be mounted on as common surface. The photovoltaic cell 502 is electrically connected in parallel with the first string of photovoltaic cells 426 and the second string of photovoltaic cells 428. The photovoltaic cell 502 can be substantially similar to the photovoltaic cells 402-416 in the first string of photovoltaic cells 426 (e.g., the photovoltaic cell 502 can be a Germanium cell in accordance with the above-noted example of FIG. 4). Thus, following the example set forth in FIG. 4, the first string of photovoltaic cells 426 and the second string of photovoltaic cells 428 can each output approximately 2.4 volts, while the photovoltaic cell 502 can be used as a bypass diode to protect the photovoltaic cells 402-424 against large reverse bias voltages.

Referring to FIG. 6, illustrated is the group 600. The group 600 includes the photovoltaic cells 402-424. In the embodiment shown in FIG. 6, the photovoltaic cell 416 is removed from the first string of photovoltaic cells 426 (as compared to the group 400 of FIG. 4). Thus, in the group 600, the first suing of photovoltaic cells 426 includes the photovoltaic cells 402-414 electrically connected in series, while the second string of photovoltaic cells 428 again includes the photovoltaic cells 418-424 electrically connected in series. Again, the photovoltaic cell 416 can be mounted on a common surface as compared to at least the photovoltaic cells 402-414.

The photovoltaic cell 416 is electrically connected in parallel with the first string of photovoltaic cells 426 and the second string of photovoltaic cells 428. Moreover, the photovoltaic cell 416 is substantially similar to the photovoltaic cells 402-414 in the first string of photovoltaic cells 426. Following the aforementioned example of FIG. 4 where the first string of photovoltaic cells 426 includes Germanium cells and the second string of photovoltaic cells 428 includes Silicon cells, the first string of photovoltaic cells 426 can output approximately 2.1 volts and the second string of photovoltaic cells 428 can output approximately 2.4 volts. While the group 600 may create a voltage mismatch between strings, such configuration can conserve area as compared to the embodiment of FIG. 5 where the extra photovoltaic cell 502 is included in the group 500.

As noted above, it is contemplated that the first string of photovoltaic cells 426 and the second string of photovoltaic cells 428 in FIGS. 5 and 6 can include substantially any number of photovoltaic cells. More particularly, the photovoltaic cells in series in a given string have an aggregate operating voltage (or open circuit voltage for margin) less than a breakdown voltage of the photovoltaic cell used as a bypass diode to protect against large reverse bias voltages (e.g., the photovoltaic cell 502 in FIG. 5, the photovoltaic cell 416 in FIG. 4); accordingly, damage to the photovoltaic cell used as the bypass diode in operation can be prevented.

Figure 7:
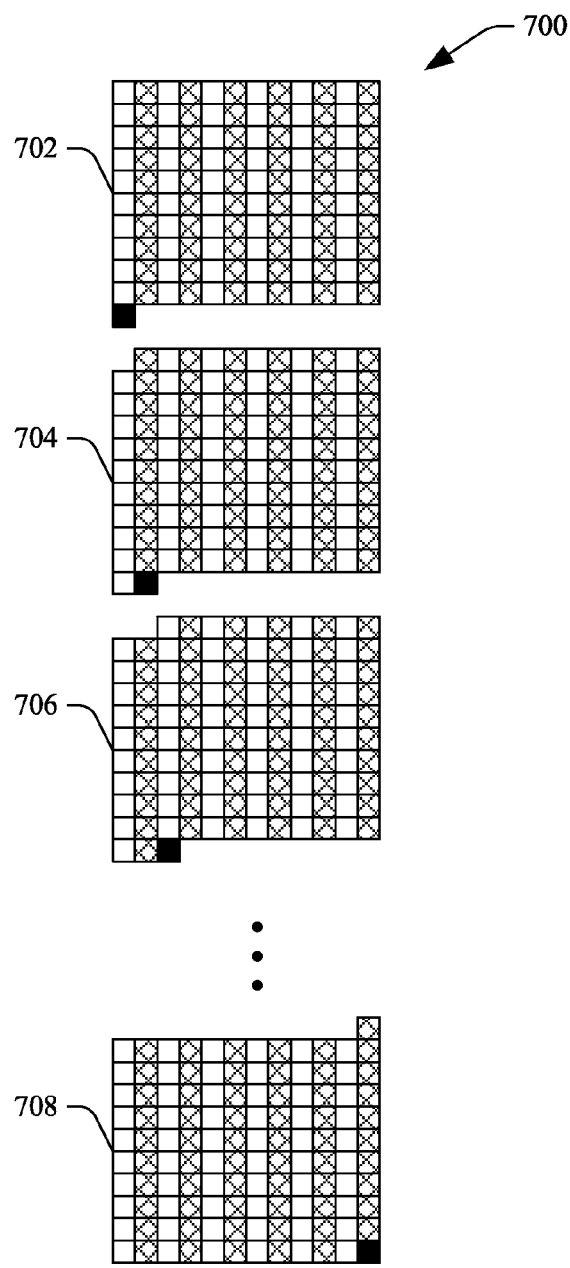
FIG. 7 illustrates another exemplary photovoltaic sub-module that can be included in as solar panel.

With reference to FIG. 7, illustrated is an exemplary photovoltaic sub-module 700 that can be included in the solar panel 100. Similar to the photovoltaic sub-module 200 of FIG. 2, the photovoltaic sub-module 700 includes a plurality of groups 702-708 of electrically connected photovoltaic cells, wherein the groups 702-708 are electrically connected in series. Each of the groups 702-708 includes a plurality of strings of series connected photovoltaic cells, where the strings of the series connected photovoltaic cells in a given group are electrically connected in parallel with an additional photovoltaic cell used as a bypass diode for the remaining photovoltaic cells in the given group (similar to the embodiment set forth in FIG. 5).

In accordance with the depicted example, each of the groups 702-708 includes twelve strings of photovoltaic cells, wherein each string includes ten photovoltaic cells electrically connected in series. Within a group, the twelve strings of photovoltaic cells are electrically connected in parallel. Moreover, each of the groups 702-708 includes an extra photovoltaic cell used as a bypass diode for the respective group, where the extra photovoltaic cell is electrically connected in parallel with the twelve strings of photovoltaic cells. Further, it is contemplated that the photovoltaic sub-module 700 can include twelve groups 702-708; yet, the claimed subject matter is not so limited.

FIG. 7 shows an exemplary physical layout for the photovoltaic sub-module 700. As depicted, the group 702 can include a rectangular array of photovoltaic cells and an extra photovoltaic cell physical located in a first column adjacent to a first string of photovoltaic cells. Further, in the group 704, a first string of photovoltaic cells can be physical offset by one photovoltaic cell in the row direction (to account for the extra photovoltaic cell included in the group 702). The group 704 also includes an extra photovoltaic cell physical located in a second column adjacent to a second string of photovoltaic cells. The foregoing layout can be continued across the photovoltaic sub-module 700. Accordingly, such layout can result in a 0.8% area loss as compared to a configuration that lacks extra photovoltaic cells used as bypass diodes; yet, the extra photovoltaic cells can enhance reliability.

Figure 8:
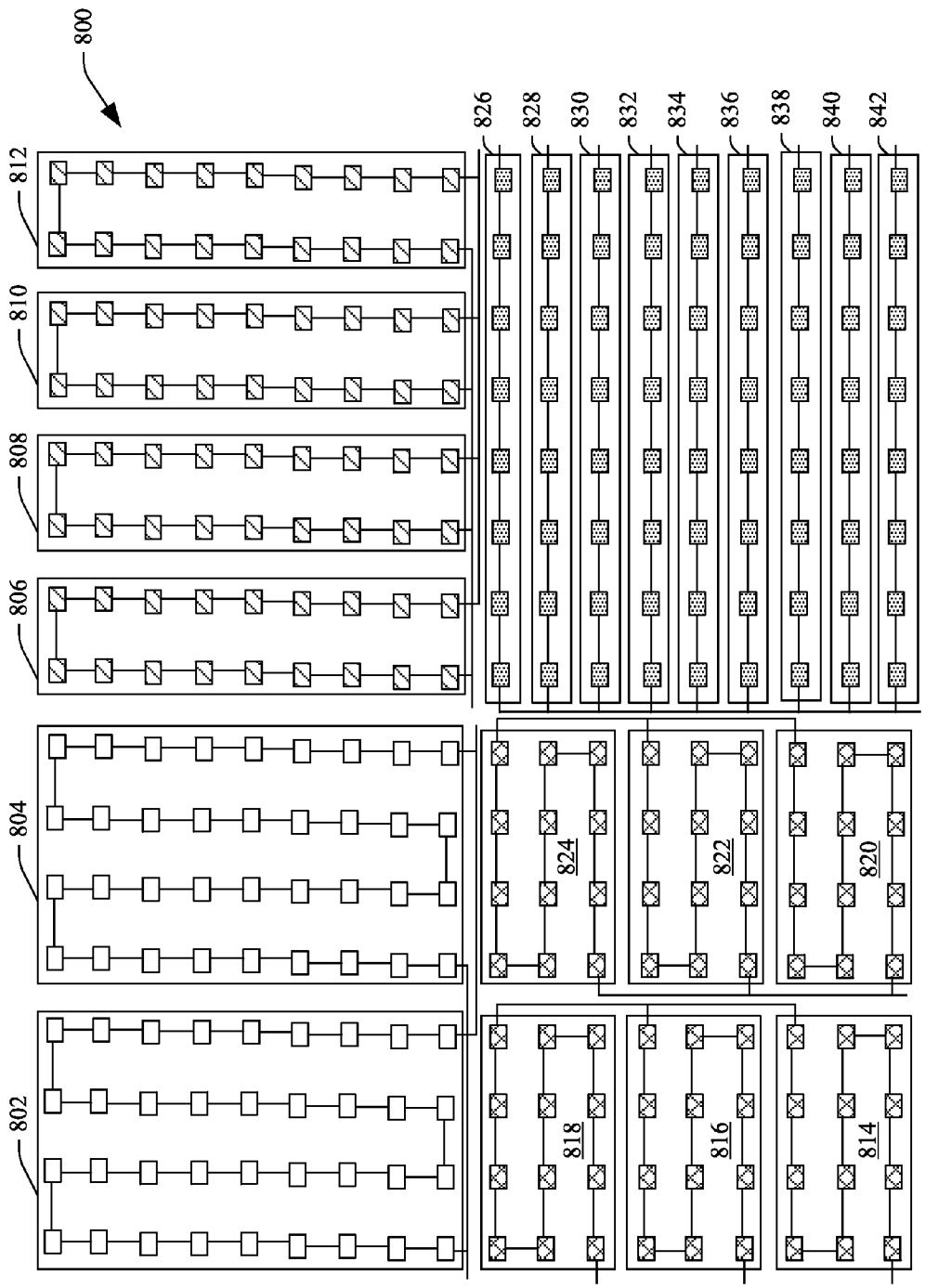
FIG. 8 illustrates another exemplary group of photovoltaic cells.

Now referring to FIG. 8, an exemplary group 800 that can be included as one of the groups 202-240 in the photovoltaic sub-module 200 of FIG. 2 is illustrated. Pursuant to an example, the group 800 can comprise a plurality of multi-junction photovoltaic cells, such that each multi-junction photovoltaic cell comprises a plurality of photovoltaic cells. As discussed above, each multi-junction photovoltaic cell can comprise a Si photovoltaic cell and a III-V photovoltaic cell. In a more specific example, each multi-junction photovoltaic cell can comprise a Ge photovoltaic cell, a Si photovoltaic cell, a GaAs photovoltaic cell and an InGaP photovoltaic cell.

The exemplary group 800 comprises 72 multi-junction photovoltaic cells, wherein each of the multi-junction photovoltaic cells comprises a Ge cell, an Si cell, a GaAs cell, and an InGaP cell. These different cells are shown as laid out adjacent to one another; however, such layout is for purposes of explanation. As indicated above, the cells in the multi-junction cells are stacked on top of one another. In another exemplary embodiment, cells can be placed in a side-by-side configuration (e.g., if spectrum spreading optics are used).

The group 800 comprises different numbers of each cell type connected in series (to create a string) to arrive at similar intermediate (higher) voltage. These strings can be connected in parallel to effectively add currents. In an example, a desired intermediate voltage output by the group 800 can be approximately 10 volts. As discussed above, a Ge cell may have an operating voltage of approximately 0.3 volts, an Si cell may have an operating voltage of approximately 0.6 volts, a GaAs cell may have an operating voltage of approximately 0.9 volts, and an InGaP cell may have an operating voltage of approximately 1.3 V. Therefore, the group 800 can comprise a first string of Ge cells 802 and a second string of Ge cells 804 that each comprises 36 cells electrically connected in series. Accordingly, each of the first string of Ge cells 802 and the second string of Ge cells 804 outputs approximately 10.8 V.

The exemplary group 800 further comprises a first string of Si cells 806, a second string of Si cells 808, a third string of Si cells 810 and a fourth string of Si cells 812. Each of the strings of Si cells 806-812 can comprise 18 cells electrically connected in series, resulting in each string outputting approximately 10.8 volts.

The group 800 can additionally comprise a first string of GaAs cells 814, a second string of GaAs cells 816, a third string of GaAs cells 818, a fourth string of GaAs cells 820, a fifth string of GaAs cells 822, and a sixth string of GaAs cells 824. Each of the strings of GaAs cells 814-824 can comprise 12 cells electrically connected in series, resulting in each string of GaAs cells outputting approximately 10.8 volts.

Further, the group 800 can also comprise a first string of InGaP cells 826, a second string of InGaP cells 828, a third string of InGaP cells 830, a fourth string of InGaP cells 832, a fifth string of InGaP cells 834, a sixth string of InGaP cells 836, a seventh string of InGaP cells 838, an eighth string of InGaP cells 840, and a ninth string of InGaP cells 842. Each of the strings of InGaP cells 826-842 can comprise eight cells electrically connected in series resulting in each string of InGaP cells outputting approximately 10.4 volts.

From the above, it can be ascertained that an intermediate operating voltage for each string of cells can be approximately 10 volts. It can further be ascertained that voltages output by strings of different cell types are not identical, and thus the voltage output by the group 800 will be the lowest voltage output by the strings of cells.

Because only one type of cell is initially connected in series in any of the strings 802-842, power output from other cells in the group 800 is relatively unaffected by spectral shifts that cause a decrease in output of one type of cell versus another. For example, a 10% reduction of current from one cell type yields a reduction in array current from 1 to 4.3% depending upon which cell has reduced solar input. Thus, the group 800 is less susceptible to output power reductions from spectral shifts that affect response of cell types in an unequal manner when compared to conventional photovoltaic modules.

Although not shown, it is contemplated that the group 800 can include a photovoltaic cell used as a bypass diode as described herein. For example, a photovoltaic cell from one of the strings 802-842, instead of being electrically connected in series with a remainder of the photovoltaic cells in such string, can be electrically connected in parallel with the strings 802-842. By way of another example, an extra photovoltaic cell can be added to the group 800, where the extra photovoltaic cell and the strings 802-842 are electrically connected in parallel.

The photovoltaic sub-module 200 can include a plurality of groups similar to the group 800, which includes multi-junction optimally connected heterogeneous cells. According to an example, one cell type can be used as bypass diodes in the plurality of groups. However, according to another example, differing cell types can be used as bypass diodes in the plurality of groups.

With reference again to FIG. 1, the solar panel 100, while not shown, can be associated with an inverter that transforms the voltage output by the solar panel 100 from DC to AC at a phase desired by a consumer of electric power produced by such solar panel 100. Further, while not shown, the solar panel 100 can comprise micro-concentrating optics configured to concentrate light from the sun onto the photovoltaic cells therein. In another exemplary embodiment, rather than undertaking precise voltage matching between cell types, microelectronics can be employed to cause intermediate voltages to be at desired levels (voltages output by each of the modules 102-148). Therefore, a photovoltaic sub-module or group can comprise one or more DC to DC converters (with micropower tracking electronics) to cause intermediate output voltages to be approximately equivalent and dynamically adjustable. Moreover, a photovoltaic group can comprise micro-inverters that transform DC voltage output by a cell or arrangement of cells into AC voltage. As the individual cells in the solar panel 100 are relatively small in size, there is sufficient room between cells, sub-modules, or groups for adding various microelectronic devices for boost conversion and power tracking, particularly when microlenses are incorporated for concentrating light.

Figure 9:
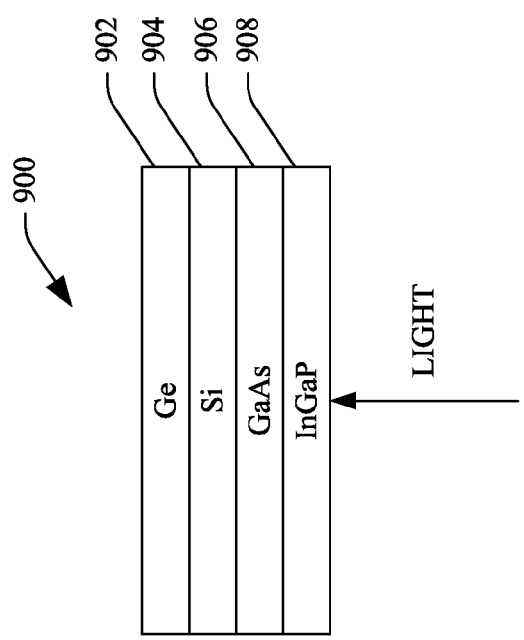
FIG. 9 illustrates an exemplary multi-junction microsystem enabled photovoltaic cell.

With reference now to FIG. 9, a cutaway view of an exemplary heterogeneously (non-monolithic) integrated multi-junction photovoltaic cell 900 is illustrated. The multi-junction photovoltaic cell 900 comprises a plurality of photovoltaic cells: an InGaP cell 902 initially receives light from the sun; a GaAs cell 904 is immediately adjacent to the InGaP cell; a Si cell 900 is immediately adjacent to the GaAs cell 904; and a Ge cell 908 is immediately adjacent to the Si cell 906. It is to be understood that other arrangements are contemplated, including alternative cell types and numbers in the multi-junction cell structure, and are intended to fall under the scope of the hereto appended claims.

Again, reference is made to FIG. 1. Exemplary embodiments where the solar panel 100 is beneficially employed include any installation where at least partial shading is possible. For example, a rooftop of a building with trees nearby, areas with intermittent cloud cover, areas proximate to air traffic, and the like. Additionally, features described herein are beneficial in installations where the solar panel 100, portions thereof, or an entire installation are flexible, curved, conformed, or otherwise non-planar in such a manner such that at least a portion of the solar panel 100 is subject to shading.

Figure 10:
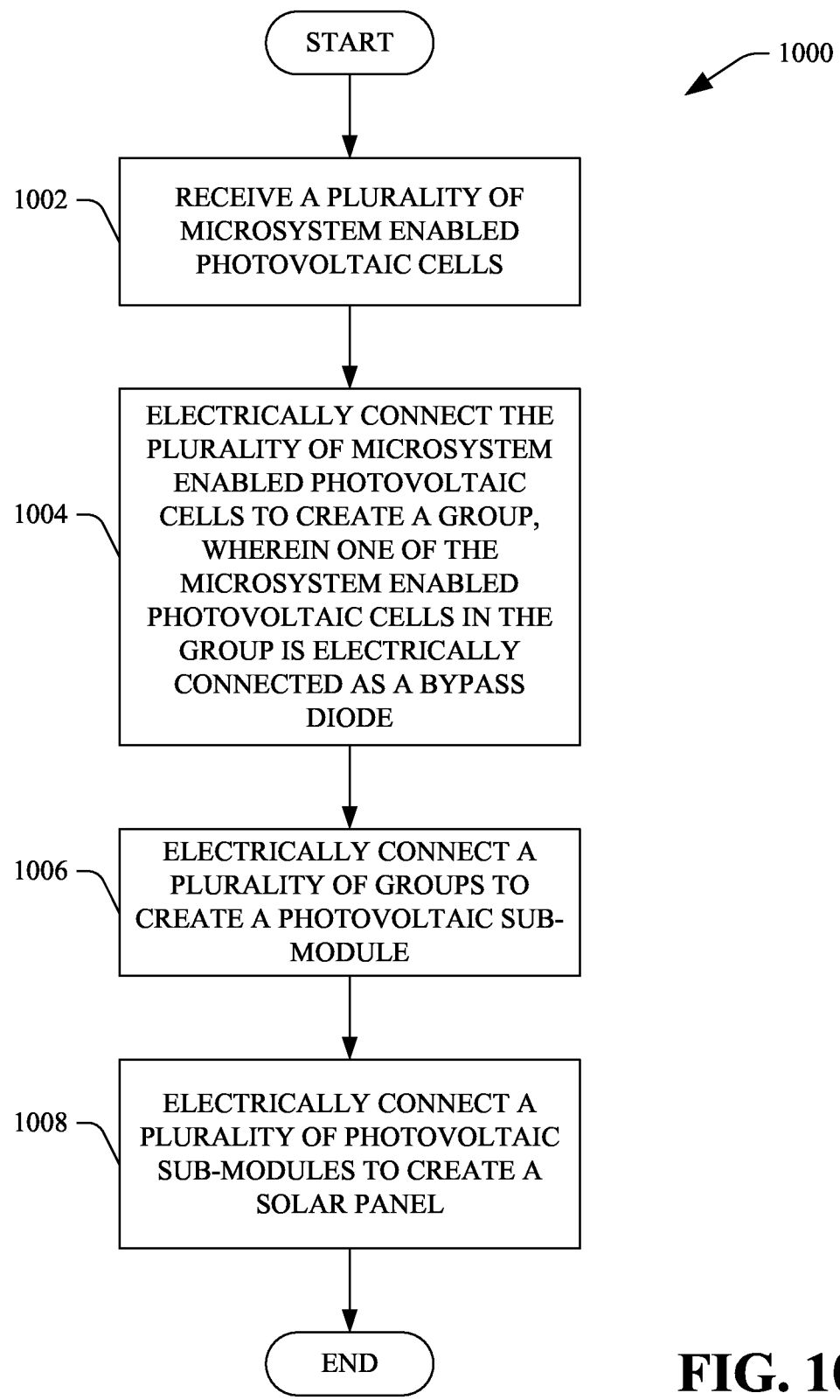
FIG. 10 illustrates an exemplary methodology for constructing a solar panel that includes photovoltaic cells, wherein a subset of the photovoltaic cells are electrically connected as bypass diodes.

With reference now to FIG. 10, an exemplary methodology is illustrated and described. While the methodology is described as being a series of acts that are performed in a sequence, it is to be understood that the methodology is not limited by the order of the sequence. For instance, some acts may occur in a different order than what is described herein. In addition, an act may occur concurrently with another act. Furthermore, in some instances, not all acts may be required to implement a methodology described herein.

Now referring to FIG. 10, an exemplary methodology 1000 that facilitates creating a solar panel is illustrated. At 1002, a plurality of microsystem enabled photovoltaic cells are received. In an exemplary embodiment, the microsystem enabled photovoltaic cells can have both positive and negative contacts on a backside thereof.

At 1004, the plurality of microsystem enabled photovoltaic cells are electrically connected to create a group, wherein one of the microsystem enabled photovoltaic cells in the group is electrically connected as a bypass diode. As discussed above, the microsystem enabled photovoltaic cell connected as the bypass diode can protect the remainder of the microsystem enabled photovoltaic cells in the group against large reverse bias voltages that can arise due to shading.

At 1006, a plurality of groups are electrically connected to create a photovoltaic sub-module. At 1008, a plurality of photovoltaic sub-modules are electrically connected to create a solar panel.

The solar panel however, in an exemplary embodiment, can include a power management integrated circuit that is electrically connected to photovoltaic sub-modules in the solar panel such that the power management integrated circuit can output electric power based, at least in part, upon voltages output by respective photovoltaic sub-modules. In another embodiment, power management integrated circuits can be placed in connection with groups, such that strings of photovoltaic cells are electrically connected to the power management integrated circuit, and the output of a sub-module is based upon voltages output by the respective groups that are connected to the integrated circuit.

Further, as used herein, the term "exemplary" is intended to mean "serving as an illustration or example of something."

What has been described above includes examples of one or more embodiments. It is, of course, not possible to describe every conceivable modification and alteration at the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fill within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. Apparatus comprising a photovoltaic submodule arranged as a rectangular array of photovoltaic (PV) cells such that the array has an integer number C of columns and is organized into C groups of PV cells connected to each other in series, wherein:

each said group of PV cells is a rectangular sub-array having C columns, and within each of said groups of PV cells, the C columns are ordered from a first column to a last column in a sequence in which each of the C columns is numbered as a Column(j), j=1, . . . , C so that each value of j represents a respective columnar position;

within the submodule, said C groups of PV cells are ordered from a first group to a last group in a sequence in which each of said C groups of PV cells is numbered as a Group(j), j=1, . . . , C, each said group of PV cells having a top row and a bottom row;

the bottom row of each said group of PV cells includes a bypass diode having a columnar position j that advances sequentially from j=1 in the first group to j=C in the C-th group;

the columnar positions that precede the bypass diode in each said bottom row are occupied by photovoltaic cells, but the columnar positions that follow the bypass diode are empty, so that the bottom rows of the first C-1 groups are partially filled rows and the bottom row of the C-th group is a filled row;

for each Group(j), j=2, . . . , C of said groups of PV cells, the top row of Group (j) nests with the bottom row of Group(j-1) so as to form one filled row of the submodule;

each of said groups of PV cells comprises two or more strings of series-connected photovoltaic cells;

the two or more strings of series-connected photovoltaic cells within each respective said group of PV cells are connected in parallel with each other and in parallel with the bypass diode included in that group of PV cells; and each said bypass diode is a photovoltaic cell.

2. The apparatus of claim 1, wherein the rectangular array is a rectangular array of microsystem enabled photovoltaic cells.

3. The apparatus of claim 2, wherein each microsystem enabled photovoltaic cell is of a size no greater than two centimeters in height and two centimeters in width.

4. The apparatus of claim 2, wherein within at least one group, the microsystem enabled photovoltaic cells in at least one string are substantially similar to the bypass diode included in that group.

5. The apparatus of claim 2, wherein an optical input of the bypass diode is blocked.

6. The apparatus of claim 2, wherein within at least one group, at least a first string and a second string are connected to each other in parallel, and:

the microsystem enabled photovoltaic cells in the first string, the microsystem enabled photovoltaic cells in the second string, and the bypass diode are all cells of the same type; and a number of the microsystem enabled photovoltaic cells in the first string equals a number of the microsystem enabled photovoltaic cells in the second string.

7. The apparatus of claim 2, wherein the rectangular array of the microsystem enabled photovoltaic cells comprises multi junction series-connected monolithic cells.

\* \* \* \* \*